US010529809B2

(12) United States Patent
Kuenle et al.

(10) Patent No.: US 10,529,809 B2
(45) Date of Patent: Jan. 7, 2020

(54) METHOD OF MANUFACTURING A POWER SEMICONDUCTOR DEVICE

(71) Applicant: Infineon Technologies AG, Neubiberg (DE)

(72) Inventors: Matthias Kuenle, Villach (AT); Daniel Schloegl, Villach (AT); Hans-Joachim Schulze, Taufkirchen (DE); Christoph Weiss, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/235,726

(22) Filed: Dec. 28, 2018

(65) Prior Publication Data
US 2019/0157401 A1 May 23, 2019

Related U.S. Application Data

(62) Division of application No. 15/634,259, filed on Jun. 27, 2017, now Pat. No. 10,186,587.

(30) Foreign Application Priority Data

Jun. 28, 2016 (DE) .......................... 10 2016 111 844

(51) Int. Cl.
*H01L 29/36* (2006.01)
*H01L 29/78* (2006.01)
(Continued)

(52) U.S. Cl.
CPC ............ *H01L 29/36* (2013.01); *H01L 21/265* (2013.01); *H01L 29/0804* (2013.01);
(Continued)

(58) Field of Classification Search
CPC ............... H01L 21/265; H01L 29/0804; H01L 29/0878; H01L 29/0882; H01L 29/1095;
(Continued)

(56) References Cited

U.S. PATENT DOCUMENTS 6,271,061 B1    8/2001   Frisina et al.
6,888,226 B2    5/2005   Diefenbeck et al.
(Continued)

FOREIGN PATENT DOCUMENTS

DE    102005049506 A1    4/2007
DE    102006046845 B4    12/2013
(Continued)

*Primary Examiner* — Allan R Wilson
(74) *Attorney, Agent, or Firm* — Murphy, Bilak & Homiller, PLLC

(57) ABSTRACT

A method of manufacturing a power semiconductor device includes: creating a doped contact region on top of a surface of a carrier; creating, on top of the contact region, a doped transition region having a maximum dopant concentration of at least $0.5*10^{15}$ cm$^{-3}$ for at least 70% of a total extension of the doped transition region in an extension direction and a maximal dopant concentration gradient of at most $3*10^{22}$ cm$^{-4}$, wherein a lower subregion of the doped transition region is in contact with the contact region and has a maximum dopant concentration at least 100 times higher than a maximum dopant concentration of an upper subregion of the doped transition region; and creating a doped drift region on top of the upper subregion of the doped transition region, the doped drift region having a lower dopant concentration than the upper subregion of the doped transition region.

15 Claims, 6 Drawing Sheets

(51) Int. Cl.
*H01L 29/739* (2006.01)
*H01L 29/861* (2006.01)
*H01L 29/10* (2006.01)
*H01L 29/08* (2006.01)
*H01L 21/265* (2006.01)
*H01L 29/66* (2006.01)

(52) U.S. Cl.
CPC ...... *H01L 29/0878* (2013.01); *H01L 29/0882* (2013.01); *H01L 29/1095* (2013.01); *H01L 29/6609* (2013.01); *H01L 29/66136* (2013.01); *H01L 29/66325* (2013.01); *H01L 29/66674* (2013.01); *H01L 29/66712* (2013.01); *H01L 29/7393* (2013.01); *H01L 29/7801* (2013.01); *H01L 29/7802* (2013.01); *H01L 29/861* (2013.01)

(58) Field of Classification Search
CPC ................. H01L 29/36; H01L 29/6609; H01L 29/66136; H01L 29/66325; H01L 29/66674; H01L 29/66712; H01L 29/7393; H01L 29/7801; H01L 29/7802; H01L 29/861
See application file for complete search history.

(56) References Cited

U.S. PATENT DOCUMENTS

| | | | |
|---|---|---|---|
| 9,496,349 B2 | 11/2016 | Lutgen et al. | |
| 9,728,611 B2 | 8/2017 | Era et al. | |
| 10,224,206 B2* | 3/2019 | Baburske | H01L 21/268 |
| 2006/0211179 A1* | 9/2006 | Siemieniec | H01L 29/0878 438/138 |
| 2008/0150073 A1 | 6/2008 | Willmeroth et al. | |
| 2008/0217627 A1 | 9/2008 | Friedrichs et al. | |
| 2013/0248861 A1 | 9/2013 | Wutte | |
| 2016/0172352 A1 | 6/2016 | Schulze et al. | |
| 2019/0035884 A1* | 1/2019 | Bauer | H01L 29/36 |

FOREIGN PATENT DOCUMENTS

| | | |
|---|---|---|
| DE | 102014118664 A1 | 6/2016 |
| EP | 2256813 A2 | 12/2010 |

* cited by examiner

METHOD OF MANUFACTURING A POWER SEMICONDUCTOR DEVICE

TECHNICAL FIELD

This specification refers to embodiments of a power semiconductor device and to embodiments of a method of processing a power semiconductor device. In particular, this specification is directed to embodiments of a semiconductor device having an epitaxially grown transition region arranged in between a drift region and a backside emitter region of the device and to corresponding embodiments of a method of processing such a power semiconductor device processing.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a load current along a load current path between two load terminals of the device. Further, if implemented as a controllable, e.g., a switchable device, the load current path may be controlled by means of an insulated control electrode, sometimes referred to as gate electrode. For example, upon receiving a corresponding control signal from, e.g., a driver unit, the control electrode may set the power semiconductor device in one of a conducting state, also referred to as on-state, and a blocking state, also referred to as off-state.

A power semiconductor device shall usually have a high degree of reliability, e.g., failures of the device, e.g., due to cosmic rays or short circuit shall be avoided.

SUMMARY

According to an embodiment, a power semiconductor device has a semiconductor body configured to conduct a load current in parallel to an extension direction between a first load terminal and a second load terminal of the power semiconductor device, the semiconductor body comprising: a doped contact region being electrically connected to the second load terminal, wherein the contact region is at least partially an epitaxially grown contact region; a doped drift region having a dopant concentration that is smaller than a dopant concentration of the contact region; and an epitaxially grown doped transition region that is separated from the second load terminal by the contact region and that couples the contact region to the drift region, the transition region comprising: an upper subregion in contact with the drift region and having a dopant concentration that varies along the extension direction and has a maximum dopant concentration that is at least $0.5*10^{15}$ cm$^{-3}$; a lower subregion in contact with the contact region and having a dopant concentration that varies along the extension direction; and a central subregion having a dopant concentration that varies along the extension direction and being arranged in between the upper subregion and the lower subregion and which has a maximum dopant concentration which is at least a factor 5 higher than the maximum dopant concentration of the upper subregion, and wherein each of the upper subregion, the central subregion and the lower subregion has a maximum dopant concentration gradient of at most $3*10^{22}$ cm$^{-4}$ and wherein the maximum dopant concentration of the lower subregion is at least a factor of 100 higher than the maximum dopant concentration of the upper subregion.

According to another embodiment, method of processing a power semiconductor device, comprising: providing a carrier having a surface; creating a doped contact region on top of the surface, wherein creating the contact region includes carrying out at least one epitaxy processing step; creating, on top of the contact region, a doped transition region that has a maximum dopant concentration of at least $0.5*10^{15}$ cm$^{-3}$ for at least 70% of the total extension of the transition region in an extension direction and a maximal dopant concentration gradient of at most $3*10^{22}$ cm$^{-4}$, wherein a lower subregion of the transition region is in contact with the contact region and has a maximum dopant concentration at least 100 times higher than the maximum dopant concentration of a upper subregion, and wherein creating the transition region includes carrying out at least one epitaxy processing step; and creating a doped drift region on top of the upper subregion of the transition region, the drift region having a lower dopant concentration than the upper subregion.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings.

DETAILED DESCRIPTION

Figure 1A:
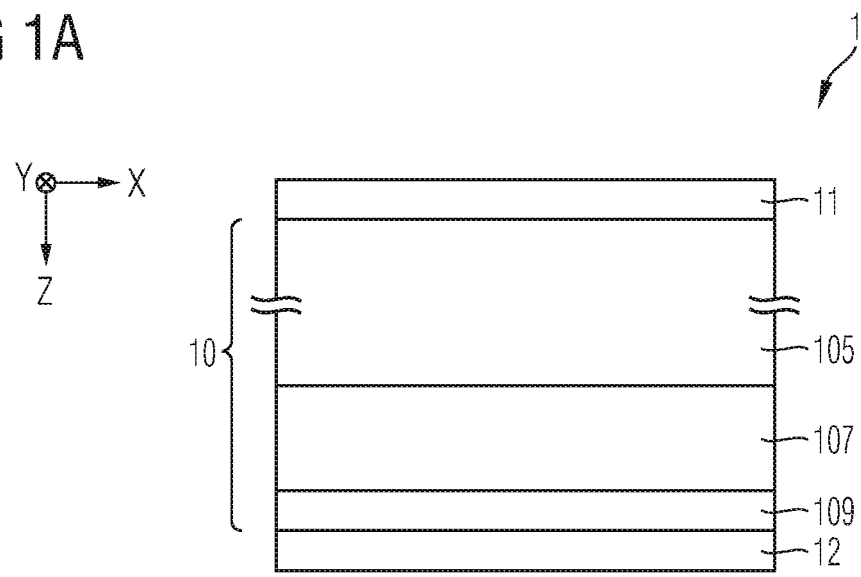
FIGS. 1A-1B each schematically and exemplarily illustrate a section of a vertical cross-section of a power semiconductor device in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above", "upper", "lower" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the extension direction Z mentioned below may be an extension direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

Further, within this specification, the term "dopant concentration" may refer to an average dopant concentration or, respectively, to a mean dopant concentration or to a sheet charge carrier concentration of a specific semiconductor region or semiconductor zone. Thus, e.g., a statement saying that a specific semiconductor region has a certain dopant concentration that is higher or lower as compared to a dopant concentration of another semiconductor region may indicate that the respective mean dopant concentrations of the semiconductor regions differ from each other.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

The term "power semiconductor device" as used in this specification intends to describe a semiconductor device on a single chip with high voltage blocking and/or high current carrying capabilities. In other words, such power semiconductor device is configured for a high load current, typically in the Ampere range, e.g., up to several ten or hundred Ampere, and/or high voltages, typically above 5 V, or above 15 V or more typically 400V and, e.g., up to some 1000 Volts.

For example, the term "power semiconductor device" as used in this specification is not directed to logic semiconductor devices that are used for, e.g., storing data, computing data and/or other types of semiconductor based data processing.

Specific embodiments described in this specification thus pertain to, without being limited thereto, a power semiconductor device (in the following simply also referred to as "semiconductor device" or "device") that may be used within a power converter or a power supply, e.g., for converting a first power signal into a second power signal different from the first power signal. For example, to this end, the power semiconductor device may comprise one or more power semiconductor cells, such as a monolithically integrated transistor cell, a monolithically integrated diode cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. Such diode cells and/or such transistor cells may be integrated in a semiconductor chip, wherein a number of such chips may be integrated in a power semiconductor module, such as an IGBT module.

Figure 1B:
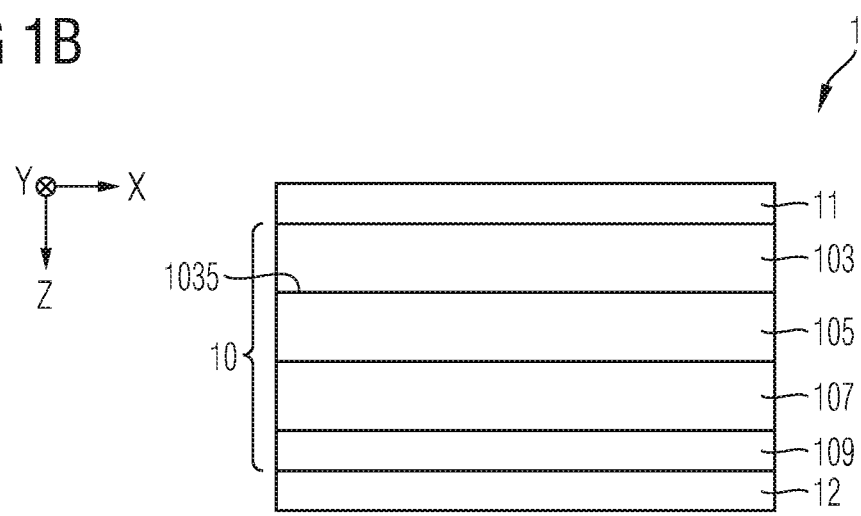

Each of FIG. 1A and FIG. 1B schematically and exemplarily illustrate a section of a vertical cross-section of a power semiconductor device 1 in accordance with an embodiment. In the illustrated examples, the vertical cross-sections are in parallel to a plane defined by the first lateral direction X and the extension direction Z. It shall certainly be understood that each of the components of the semiconductor device 1 may extend along the second lateral direction Y.

The semiconductor device 1 may have a semiconductor body 10 that is configured to conduct a load current in parallel to the extension direction Z. For example, the semiconductor body 10 is coupled to a first load terminal 11 and a second load terminal 12, wherein the load current may be fed into semiconductor body 10 via the second load terminal 12 and output by the first load terminal 11 and/or vice versa. For example, the semiconductor body 10 may be configured to conduct a load current of at least 10 A, at least 100 A, or of at least 1000 A.

The first load terminal 11 may comprise a front side metallization that may be electrically connected to the semiconductor body 10, e.g., by means of a diffusion barrier. Further, the second load terminal 12 may comprise a backside metallization that may be connected to another side of the semiconductor body 10, e.g., also by means of a diffusion barrier.

As already indicated above, the semiconductor device 1 may have at least one of the diode configuration and a transistor configuration, e.g., a power diode configuration and/or an IGBT or a MOSFET configuration. To this end, the semiconductor body 10 may comprise corresponding doped semiconductor regions.

For example, in a central part of the semiconductor body 10, there may be arranged a doped drift region 105 (in case of a diode configuration also referred to as "base region") that may comprise dopants of the first conductivity type, e.g., at a comparatively weak dopant concentration. For example, the drift region 105 is an n⁻-region. In an embodiment, the dopant concentration of the drift region 105 is within the range of $5*10^{12}$ cm$^{-3}$ to $3*10^{14}$ cm$^{-3}$.

For example, referring to FIG. 1B, the semiconductor body 10 may further comprise a doped body region 103 arranged in contact with the drift region 105, wherein the body region 103 can be doped with dopants of a conductivity type complementary to the dopants included in the drift region 105, e.g., with dopants of the second conductivity type. For example, the body region 103 can be p-region or a p⁺-region. In an embodiment, the dopant concentration of the body region 103 is within the range of $1*10^{13}$ cm$^{-3}$ to $1*10^{19}$ cm$^{-3}$.

The body region 103 may be electrically connected to the first load terminal 11. If implemented in a transistor configuration, the semiconductor body 10 could further comprise a source region (not illustrated) that is arranged in electrical contact with the first load terminal 11 and that is isolated from the drift region 105 by the body region 103.

Further, a transition between the body region 103 and the drift region 105 may form a pn-junction 1035. In an embodiment, the pn-junction 1035 is configured to block a voltage of at least 20 V applied between the first load terminal 11 and the second load terminal 12. The blocking voltage capability of the semiconductor device 1 may be significantly higher than 20 V in other embodiments. For example, said pn-junction 1035 may be configured to block a voltage of at least 100 V, of at least 1000 V, or even more than 1.5 kV. For example, when the blocking voltage is applied between the load terminals 11 and 12, it may be decreased within the semiconductor body 10 substantially along the total extension in the extension direction Z of the drift region 105. Said total extension of the drift region 105 may be within the range of 10 µm to 200 µm.

The semiconductor body 10 may further comprise a doped contact region 109 that is electrically connected to the second load terminal 12. For example, the contact region 109 is arranged in contact with the second load terminal 12. The contact region 109 may be doped with dopants of the same conductivity type as the drift region 105. For example, the dopant concentration of the drift region 105 is smaller than the dopant concentration of the contact region 109. For example, the contact region 109 is doped with dopants of the first conductivity type, e.g., at a comparatively high dopant concentration. The contact region 109 may be an n⁺-region, for example. In an embodiment, the dopant concentration of the contact region 109 is within the range of $1*10^{16}$ cm$^{-3}$ to $1*10^{20}$ cm$^{-3}$.

For example, the contact region 109 forms a backside emitter region or a drain region of the semiconductor device 1. Further, in an embodiment, the drift region 105 may be separated from each of the first load terminal 11 and the second load terminal 12, wherein a separation between the drift region 105 and the first load terminal 11 may comprise, e.g., the body region 103 and, e.g., a source region. A separation between the drift region 105 and the second load terminal 12 may comprise, e.g., the contact region 109.

Figure 2:
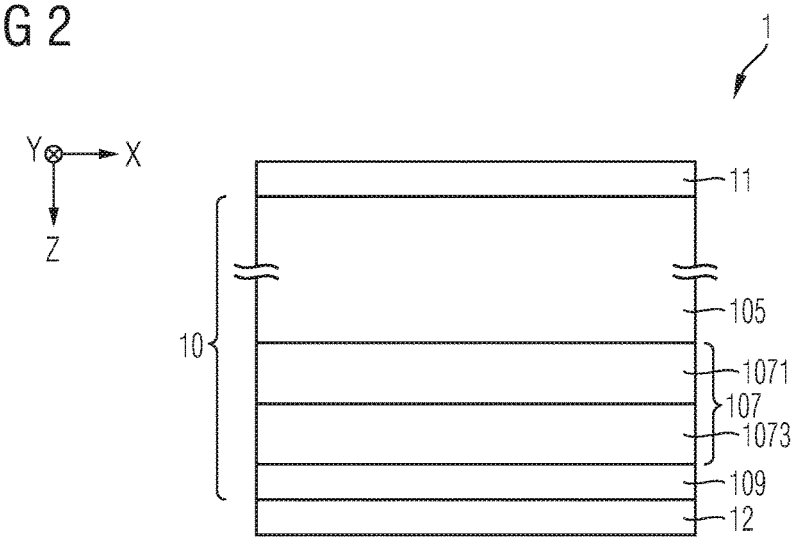
FIG. 2 schematically and exemplarily illustrates a section of a vertical cross-section of a power semiconductor device in accordance with one or more embodiments.

The semiconductor body 10 may further comprise an epitaxially grown doped transition region 107 that may be arranged in between the drift region 105 and the contact region 109. For example, the transition region 107 is separated from the second load terminal 12 by the contact region 109. Further, the transition region 107 may couple the contact region 109 to the drift region 105. For example, the transition region 107 is arranged in contact with the drift region 105 on the one side and arranged in contact with the contact region 109 on the other side. In an embodiment, as schematically and exemplarily illustrated in FIG. 2, the transition region 107 may comprise an upper subregion 1071 and a lower subregion 1073, wherein the upper subregion 1071 may be arranged in contact with the drift region 105 and wherein the lower subregion 1073 may be arranged in contact with the contact region 109. Each of the upper subregion 1071 and the lower subregion 1073 may be epitaxially grown regions.

For example, the transition region 107 is doped with dopants of the first conductivity type, e.g., at a greater dopant concentration as compared to the dopant concentration of the drift region 105 and/or at a smaller dopant concentration as compared to the dopant concentration of the contact region 109. As has already been explained in more general terms above, the dopant concentration may be an average dopant concentration, e.g., a mean or average dopant concentration with regards to the total extension of the transition region 107 along the extension direction Z. Thus, it shall be understood that, in accordance with some embodiments, the dopant concentration of the transition region 107 may vary along the extension direction Z, which will be explained in more detail below.

In an embodiment, the epitaxially grown transition region 107 may have a maximum dopant concentration of at least $0.5*10^{15}$ cm$^{-3}$, of $1*10^{15}$ cm$^{-3}$ or at least $1*10^{16}$ cm$^{-3}$ or even at least $5\times10^{16}$ cm$^{-3}$. Said maximum dopant concentration may be present for at least 5% of the total extension of the transition region 107 in the extension direction Z, or for more than 10%, for more than 15% or for even more than 30% of said total extension of the transition region 107 in the extension direction Z. In an embodiment, the epitaxially grown transition region 107 may have a maximum dopant concentration of at least $0.5*10^{15}$ cm$^{-3}$, of $1*10^{16}$ cm$^{-3}$ or at least $2\times10^{16}$ cm$^{-3}$ or even at least $5\times10^{16}$ cm$^{-3}$ at every position in a section amounting to at least 20% or at least 50% or at least 70% of the total extension of the transition region 107 in the extension direction Z.

Further, the total extension of the epitaxially grown transition region 107 in the extension direction Z may be greater than 3 µm, greater than 5 µm, greater than 8 µm or even greater than 10 µm.

In an embodiment, each of the contact region 109, the drift region 105 and the transition region 107 are doped with dopants of the same conductivity type. For example, each of the contact region 109, the drift region 105 and the transition region 107 are doped with the same dopant material, e.g., with n-type dopants. For example, the dopant material present in at least one of the contact region 109, the transition region 107 and the drift region 105 comprises at least one of phosphorus, antimony and arsenic. In another embodiment, the dopant material in the transition region 107 may be different from the dopant material in the contact region 109 and/or different from the dopant material in the drift region 107. For example, the contact region 109 may comprise dopants of the second conductivity type, e.g., p-type dopants, e.g., for forming a backside emitter of an IGBT.

In an embodiment, the contact region 109 is at least partially an epitaxially grown contact region. Thus, each of the contact region 109 and the transition region 107 that may be arranged on top of the contact region 109 may have been produced by means of a respective epitaxy processing step, as will be explained in more detail below. In another embodiment, the dopants of the contact region 109 may have been introduced by means of implantation and/or by means of diffusion.

Figure 3:
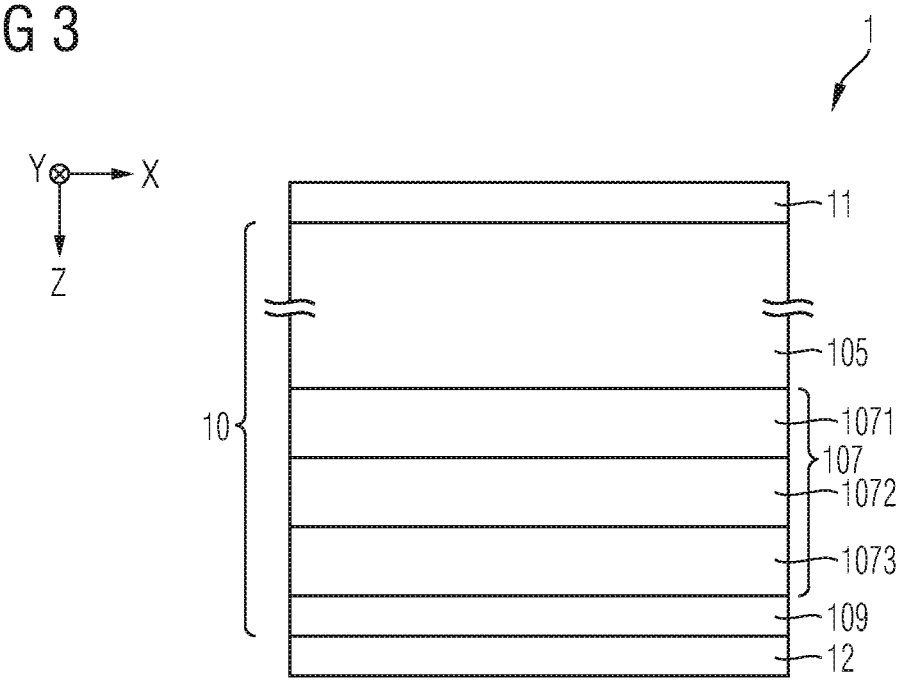
FIG. 3 schematically and exemplarily illustrates a section of a vertical cross-section of a power semiconductor device in accordance with one or more embodiments.

Now referring to FIG. 3, which schematically and exemplarily illustrates a section of a vertical cross-section of a power semiconductor device 1 in accordance with one or more embodiments, the transition region 107 may further comprise a central subregion 1072 arranged in between the upper subregion 1071 and the lower subregion 1073. For example, each of the upper subregion 1071, the central subregion 1072 and the lower subregion 1073 has a maximum dopant concentration of at least $0.5*10^{15}$ cm$^{-3}$ at every position in a section amounting to at least 20% or at least 50% or at least 70% of the respective total extensions of the subregions 1071 to 1073 in the extension direction Z, e.g., of dopants of the same conductivity type, e.g., of n-type dopants.

For example, one or more or all of the upper subregion 1071, the central subregion 1072 and the lower subregion 1073 have a respective total extension amounting to at least 3 µm, to at least 4 µm or to at least 5 µm.

In an embodiment, the upper subregion 1071 forms a field stop region (also referred to as buffer region) of the semiconductor device 1. For example, if the semiconductor body 10 has a transistor configuration, e.g., an IGBT configuration the upper subregion 1071 may is a field stop region. The upper subregion 1071 may have a minimum dopant concentration and/or a dopant concentration that may vary along the extension direction Z, wherein such a dopant concentration profile may be provided by means of carrying out one or more epitaxy processing steps, in accordance with an embodiment, as will be explained in more detail below.

In an embodiment, the central subregion 1072 may be configured to increase a short-circuit strength of the semiconductor device 1. For example, the central subregion 1072 may be configured to reduce at least one of an electron current in a short-circuit event and a peak of an electrical field in proximity to the second terminal 12. The central subregion 1072 may have a minimum dopant concentration and/or a dopant concentration that may vary along the extension direction Z, wherein such a dopant concentration profile may be provided by means of carrying out one or more epitaxy processing steps, in accordance with an embodiment, as will be explained in more detail below.

In a yet further embodiment, the lower subregion 1073 may be configured to increase a cosmic ray robustness of the semiconductor device 1. For example, the lower subregion 1073 may be configured to act as a charge carrier compensation region, e.g., such that cosmic radiation induced electron currents (also known as streamers) may be compensated. The lower subregion 1073 may have a maximum dopant concentration, which is higher than a maximum dopant concentration of at least one of the subregions 1071 and 1072 or higher than each of a maximum dopant concentration of subregion 1071 and a maximum dopant concentration of subregion 1072. Additionally, the dopant concentration of the lower subregion 1073 may vary along the extension direction Z, wherein such a dopant concentration profile may be provided by means of carrying out one or more epitaxy processing step, in accordance with an embodiment, as will be explained in more detail below.

Figure 4:
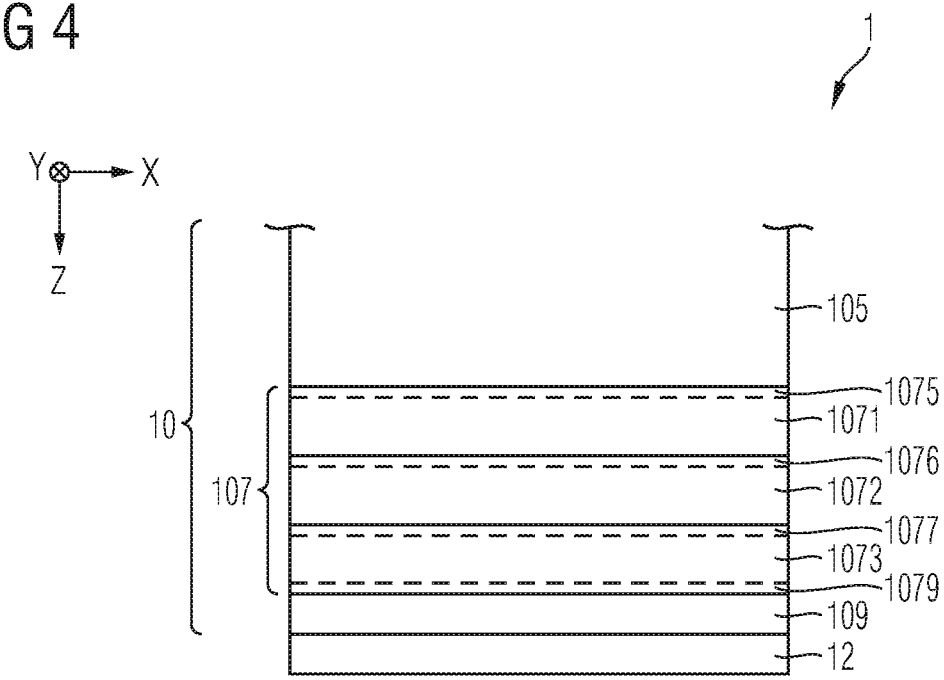
FIG. 4 schematically and exemplarily illustrates a section of a vertical cross-section of a power semiconductor device in accordance with one or more embodiments.
Figure 5:
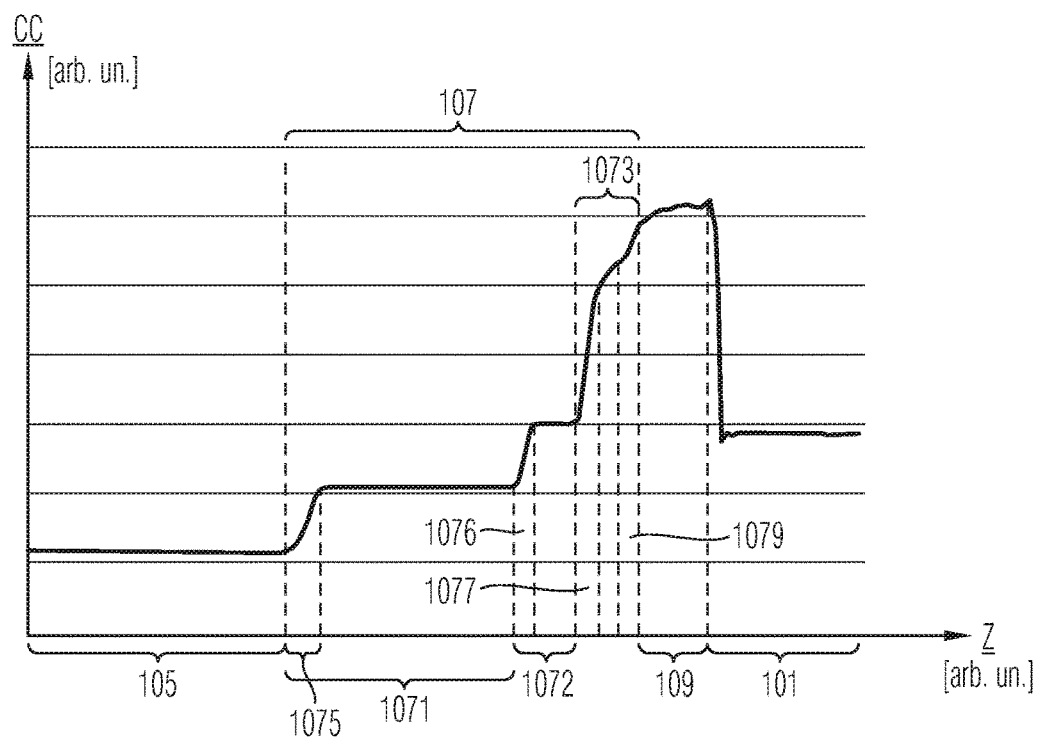
FIG. 5-7 each schematically and exemplarily illustrate a course of a dopant concentration in an extension direction in accordance with one or more embodiments.
Figure 6:
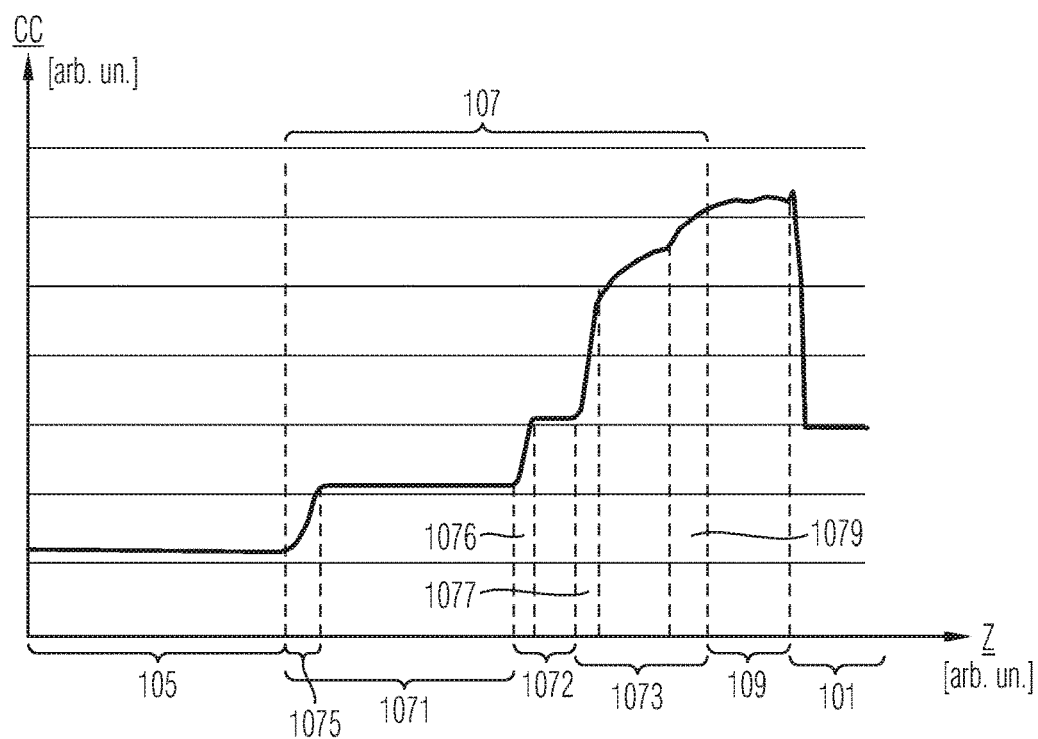
Figure 7:
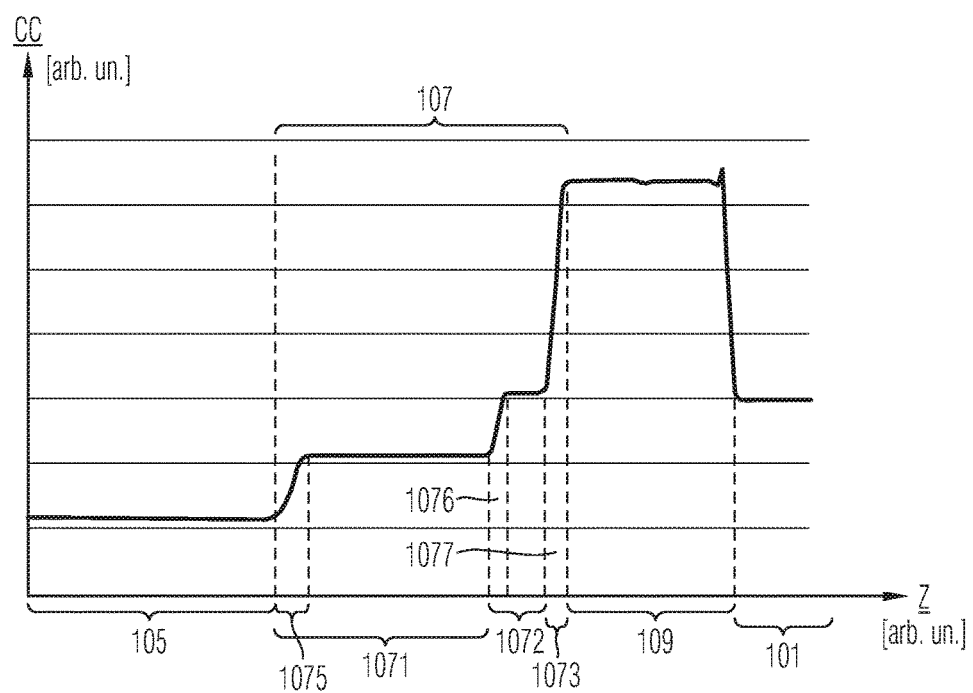

With respect to each of FIG. 4, which schematically and exemplarily illustrates a section of a vertical cross-section of a power semiconductor device 1 in accordance with one or more embodiments, and FIGS. 5-7, which each schematically and exemplarily illustrate a course of a dopant concentration CC in the extension direction Z, some exemplary dopant concentration profiles of the semiconductor body 10 including the transition region 107 shall be presented. However, even though FIGS. 4-7 each illustrate a central subregion 1072 as a part of the transition region 107, it shall be understood that in other embodiments, the transition region 107 may also only comprise the upper subregion 1071 and the lower subregion 1072.

Before presenting the exemplary dopant concentration provides, it shall further be understood that, in an embodiment, each of the aforementioned regions of the semiconductor body 10, namely the body region 103, the drift region 105, the transition region 107 including its subregions, and the contact region 109 may be arranged in an active zone of the semiconductor body 10, i.e., each of said regions 103, 105, 107 including its subregions, and 109 may be configured to conduct the load current in parallel to the extension direction Z and, e.g., they may each form load current carrying elements of the semiconductor device 1. Further, in an embodiment, each of said regions 103, 105, 107 including its subregions, and 109 may be formed as a respective semiconductor layer, wherein said layers may be arranged on top of each other in a sandwich like manner, as schematically and exemplarily illustrated in each of FIG. 1A to FIG. 4.

Regarding the exemplary dopant concentration profiles in accordance with FIGS. 5 to 7, the extension direction Z may be indicated in an arbitrary unit (arb. un.), e.g., in µm, and the dopant concentration CC may be indicated in another arbitrary unit (arb. un.), e.g., in cm$^{-3}$, in accordance with an embodiment.

For example, referring to all three variants according to FIGS. 5 to 7, the drift region 105, which may have a total extension in the extension direction Z within the range of 10 µm to 200 µm, may have a dopant concentration within the range as has been stated above. For example, the dopant concentration of the drift region 105 amounts to $1*10^{13}$ cm$^{-3}$ and is substantially constant along the entire total extension of the drift region 105.

Then, proceeding further along the extension direction Z and still referring to all three variants according to FIGS. 5 to 7, at a transition from the drift region 105 to the upper subregion 1071 of the transition region 107, the dopant concentration may increase, e.g., in a step-like manner or in gradual manner. For example, the upper subregion 1071 has a first dopant concentration gradient in the extension direction Z of at most $1*10^{21}$ cm$^{-4}$ or at most $3*10^{21}$ cm$^{-4}$ or at most $3*10^{22}$ cm$^{-4}$ for at least 5% or at least 20% or at least 50% of the total extension of the upper subregion 1071 in the extension direction Z. For example, said percentage of the total extension of the upper subregion 1071 is formed by a section 1075 of the transition region 107 furthest from the second load terminal 12. In an embodiment, the dopant concentration increases by a factor of at least 5 or at least 10 or at least 30 within said section 1075, wherein at the same time the section 1075 may have a total extension in the extension direction Z of less than 20 µm or less than 10 µm or even less than 5 µm. For example, said section 1075 that may have the first dopant concentration gradient in the extension direction Z of at most $1*10^{21}$ cm$^{-4}$ or of at most $3*10^{21}$ cm$^{-4}$ or at most $3*10^{22}$ cm$^{-4}$ amounts to more than 10% or more than 30% or more than 50% or even more than 70% of the total extension of the upper subregion 1071 in the extension direction Z. In an embodiment, the dopant concentration within the upper subregion 1071 may essentially remain constant within at most 90% or at most 50% or at most 30% of the total extension of the upper subregion 1071 in the extension direction Z. Thus, for example, the dopant concentration of the upper subregion 1071 may have a step or a gradual profile, according to which the dopant concentration increases at the beginning of the upper subregion 1071 and then remains substantially constant for the remaining part of the total extension in the extension direction Z, e.g., at a level of e.g. $1*10^{14}$ cm$^{-3}$ or at a level of e.g. $5*10^{14}$ cm$^{-3}$ or at a level of e.g. $8*10^{14}$ cm$^{-3}$.

Further along the extension direction Z and still referring to all three variants according to FIGS. 5 to 7, the dopant concentration of the central subregion 1072 may have a similar profile as the dopant concentration of the upper subregion 1071. Accordingly, at the transition from the upper subregion 1071 of the transition region 107 to its central subregion 1072, the dopant concentration may increase, e.g., in a step-like or in a gradual manner. For example, the central subregion 1072 has a third dopant concentration gradient in the extension direction Z of at most $1*10^{21}$ cm$^{-4}$ or at most $3*10^{21}$ cm$^{-4}$ or at most $3*10^{22}$ cm$^{-4}$ for at least 5% or at least 20% or at least 50% of the total extension of the central subregion 1072 in the extension direction Z. For example, said percentage of the total extension of the central subregion 1072 are formed by a section 1076 of the central subregion 1072 closest to the upper subregion 1071. In an embodiment, the dopant concentration may increase by a factor of at least 5 or at least 10 with said section 1076, wherein at the same time the section 1076 may have a total extension in the extension direction Z of less than 10 µm or of less than 5 µm. For example, said section 1076 that may have the third dopant concentration gradient in the extension direction Z of at most $1*10^{21}$ cm$^{-4}$ or of at most $3*10^{21}$ cm$^{-4}$ or at most $3*10^{22}$ cm$^{-4}$ amounts to more than 10% or more than 30% or more than 50% of the total extension of the central subregion 1072 in the extension direction Z. In an embodiment, the dopant concentration within the central subregion 1072 may essentially remain constant within at most 90% of the total extension of the central subregion 1072 in the extension direction Z. Thus, for example, the dopant concentration of the central subregion 1072 may have a step or gradual profile, according to which the dopant concentration increases at the beginning of the central subregion 1072 and then remains substantially constant for the remaining part of the total extension in the extension direction Z, e.g., at a level of $1*10^{15}$ cm$^{-3}$ or, e.g., at a level of $3*10^{15}$ cm$^{-3}$.

Further along the extension direction Z and still referring to all three variants according to FIGS. 5 to 7, the lower subregion 1073 may follow the central subregion 1072. For example, the lower subregion 1073 begins with the first section 1077 in which the dopant concentration rapidly increases, e.g., by a factor of at least 10, of at least 100 or even of at least 1000 within a distance smaller than 10 µm or smaller than 5 µm or smaller than 3 µm. Accordingly, the lower subregion 1073 may have a second dopant concentration gradient in the extension direction of at most $1*10^{21}$ cm$^{-4}$. or of at most $3*10^{21}$ cm$^{-4}$ or at most $3*10^{22}$ cm$^{-4}$ for at least 5% of the total extension of the lower subregion 1073 in the extension direction Z. For example, said first section 1077 has a dopant concentration gradient in the extension direction of at most $1*10^{21}$ cm$^{-4}$. or of at most $3*10^{21}$ cm$^{-4}$ or at most $3*10^{22}$ cm$^{-4}$ and amounts to more than 10% or to more than 30% or more than 50% or even more than 70% of the total extension of the lower subregion 1073 in the extension direction Z. Further, the lower subregion 1073 may have a maximum dopant concentration of at least $1*10^{16}$ cm$^{-3}$.

In accordance with the embodiment schematically illustrated in FIG. 7, the dopant concentration of the lower subregion 1073 may have a similar profile, at least at the beginning, as the dopant concentration of the upper subregion 1071 and the dopant concentration of the central subregion 1072, i.e., a step-like or a gradual profile. Accordingly, at the transition from the central subregion 1072 of the transition region 107 to its lower subregion 1073, the dopant concentration may rapidly increase, e.g., in a step-like manner, wherein said step-like increase may be significantly greater as compared to each of the increases that may be included in the upper subregion 1071 and the central subregion 1072. For example, the lower subregion 1073 has said second dopant concentration gradient in the extension direction Z of at most $1*10^{21}$ cm$^{-4}$ or of at most $3*10^{21}$ cm$^{-4}$ for at least 5% of the total extension of the lower subregion 1073 in the extension direction Z. For example, said at least 5% or 10% of the total extension of the lower subregion 1073 are formed by said first section 1077 of the lower subregion 1073 closest to the central subregion 1072. In an embodiment, the dopant concentration may increase by a factor of at least 10 or 100, or even of at least 1000, with said first section 1077, wherein at the same time the first section 1077 may have a total extension in the extension direction Z of less than 5 µm or less than 3 µm. For example, said first section 1077 that may have the second dopant concentration gradient in the extension direction Z of at most or of at most $3*10^{21}$ cm$^{-4}$ amounts to less than 10% or less than 30% or less than 50% of the total extension of the lower subregion 1073 in the extension direction Z. In an embodiment, as illustrated in FIG. 7, the contact region 109 may connect to the transition region 107 where the dopant concentration gradient of the lower subregion 1073 decreases to substantially zero. Thus, for example, the dopant concentration may increase along the extension direction Z, and then, at the transition to the contact region 109, remains substantially constant for the remaining part of the total extension in the extension direction Z, e.g., at a level of at least $1*10^{18}$ cm$^{-3}$, or $3*10^{18}$ cm$^{-3}$, or of at least $1*10^{19}$ cm$^{-3}$. The latter dopant concentration level may thus be the level of the contact region 109 that follows the lower subregion 1073 along the extension direction Z, as schematically illustrated in FIG. 7. Thus, for example, a transition between the lower subregion 1073 and the contact region 109 must not necessarily include a significant change in dopant concentration. Alternatively, the dopant level of subregion 1073 may be lower than in the contact region 109, as will now be explained in more detail.

In accordance with the embodiments schematically illustrated in FIGS. 5 and 6, the dopant concentration of the lower subregion 1073 may have another profile, according to which a rapid increase occurs within said first section 1077, e.g., with the second dopant concentration gradient in the extension direction Z of at most $1*10^{21}$ cm$^{-4}$ or of at most $3*10^{21}$ cm$^{-4}$ or at most $3*10^{22}$ cm$^{-4}$, wherein said first section 1077 may amount to more than 10% or more than 30% or more than 50% or even more than 70% of the total extension of the lower subregion 1073 in the extension direction Z. Then, proceeding along the extension direction Z, the gradient of the dopant concentration may decrease again until the beginning of the second section 1079, where the gradient may increase again. For example, within the second section 1079, which may be such a section of the transition region 107 that is closest to the second load terminal 12, the gradient of the dopant concentration may again amount to at most $1*10^{21}$ cm$^{-4}$ or at most $3*10^{21}$ cm$^{-4}$ or at most $3*10^{22}$ cm$^{-4}$ for at least 5% or for at least 10% or for at least 30% of the total extension of the total extension of the lower subregion 1073 in the extension direction Z. Then, the gradient of the dopant concentration in the second section 1079 may decrease until a transition to the contact region 109 is reached.

For example, lowering the dopant concentration gradient in the lower sublayer 1073, as schematically illustrated in FIG. 6, may decrease the electric field strength and increase a cosmic ray robustness. In accordance with the embodiment of FIG. 7, the total extension of the contact region 109 having the comparatively high dopant concentration may allow for shifting a maximum electric field strength to a center of the semiconductor body 10 so as to, e.g., more effectively provide for a thermal decoupling of the second load terminal 12 (cf. FIGS. 1A to 4) from the semiconductor body 10.

The power semiconductor device 1 in accordance with one or more of the embodiments illustrated in FIGS. 1A to 7 may have one of a MOSFET configuration, an IGBT configuration and a diode configuration.

During manufacturing the semiconductor device 1, the contact region 109 may be deposited on a semiconductor substrate 101, as schematically illustrated in each of FIG. 5-7. However, in an embodiment, such semiconductor substrate 101 may be removed such that a back surface of the contact region 109 becomes exposed and the second load terminal 12 may be provided and coupled to said back surface of the contact region 109.

Figure 8:
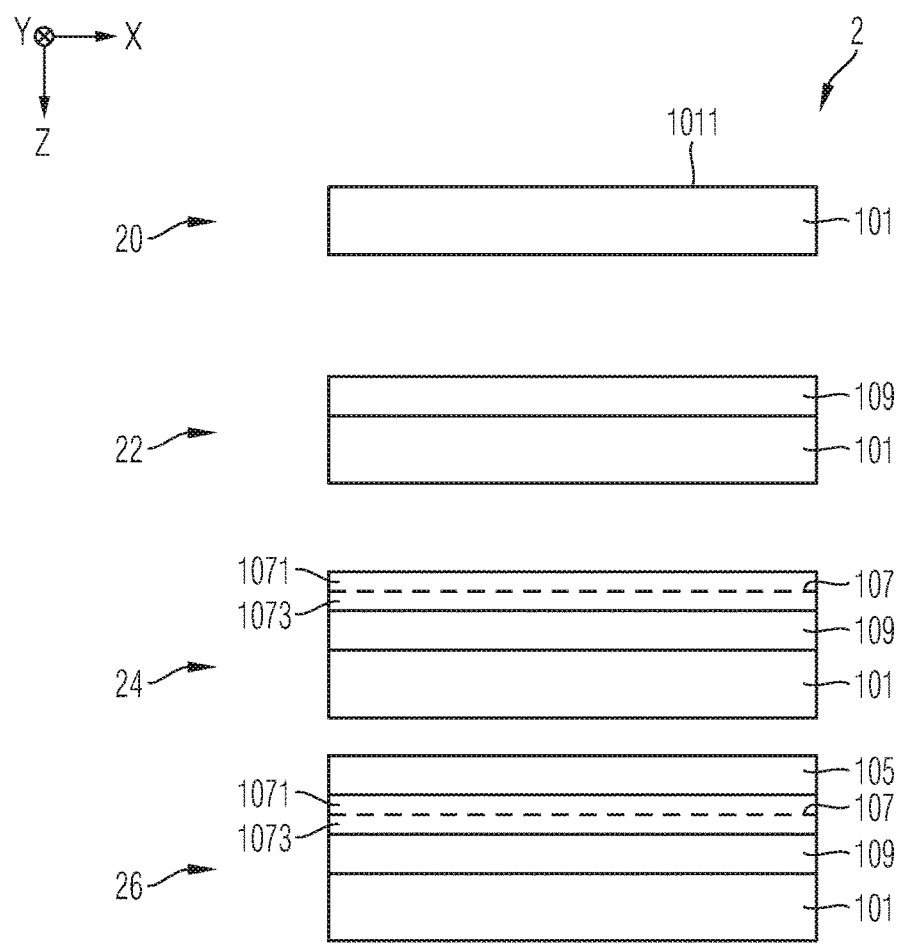
FIG. 8 schematically and exemplarily illustrates steps of a power semiconductor device processing method based on respective sections of a vertical cross-section of a semiconductor body in accordance with one or more embodiments.

An exemplary method of processing a semiconductor device, e.g., the semiconductor device 1 in accordance with one or more of the embodiments illustrated above, shall now be presented with respect to FIG. 8, which schematically and exemplarily illustrates steps of a power semiconductor device processing method 2 based on respective sections of a vertical cross-section of a semiconductor body 10. Before describing this embodiment of the power semiconductor device processing method 2, it shall be made clear that everything what has been stated above about the embodiments of the power semiconductor device 1, e.g., as illustrated in FIGS. 1A to 7, may analogously apply to the processing method described below.

In a first step 20, a carrier 101 may be provided that has a surface 1011. As has already been indicated above, the carrier 101 may be a semiconductor substrate. The surface may be in parallel to a plane defined by the first lateral direction X and the second lateral direction Y.

In a next step 22, a doped contact region 109 may be created on top of the surface 1011. This step may include carrying out at least one epitaxy processing step. In other words, the doped contact region 109 may be epitaxially grown on top of the carrier 101, i.e., against the extension direction Z. The doped contact region 109 may form a backside emitter region or a drain region of the device 1, as has been explained above.

A further step 24 may include creating, on top of the contact region 109, a doped transition region 107 that has a maximum dopant concentration of at least $0.5*10^{15}$ cm$^{-3}$ for at least 5% or at least 10% or at least 20% or at least 70% of the total extension of the transition region 107 in the extension direction Z, wherein a lower subregion 1073 of the transition region 107 may be in contact with the contact region 109 and may have a maximum dopant concentration at least 100 times higher than the maximum dopant concentration of a upper subregion. Further, the doped transition region 107 may have a maximal dopant concentration gradient of at most $3*10^{22}$ cm$^{-4}$, in accordance with an embodiment. Creating 24 the transition region 107 includes carrying out at least one epitaxy processing step. Thus, the transition region 107 may be epitaxially grown on top of the contact region 109, in accordance with one or more embodiments. The transition region 107 may further include a central subregion 1072 having a dopant concentration that varies along the extension direction Z and being arranged in between the upper subregion 1071 and the lower subregion 1073 and which may have a maximum dopant concentration which is at least a factor 5 higher than the maximum dopant concentration of the upper subregion 1071.

Then, in step 26, a doped drift region 105 may be created on top of an upper subregion 1071 of the transition region 107, wherein the doped drift region 105 may have a lower dopant concentration than the upper subregion. Also creating the doped drift region 105 may include carrying out at least one epitaxy processing step.

The one or more epitaxy processing steps applied during the creation (cf. step 24) of the transition region 107 may include a time dependent admixture of dopants, e.g., at least one of phosphorus, antimony and arsenic, during the epitaxial growth. This may allow for achieving the specific dopant concentration profile along the extension direction Z, e.g., a profile as schematically and exemplarily illustrated in one of FIGS. 5 to 7. For example, by means of the time dependent admixture of dopants, said gradient of at most $1*10^{21}$ cm$^{-4}$ or of at most $3*10^{21}$ cm$^{-4}$ or at most $3*10^{22}$ cm$^{-4}$ may be established within at least a section of the transition region 107, e.g., in one or more of said sections 1075, 1076, 1077 and 1079.

In an embodiment, the epitaxial growth of the transition region 107 occurs in a direction in parallel to a direction of a load current that may later traverse the transition region 107, as has been elucidated with respect to FIGS. 1-4 above. Thus, each of the direction of the epitaxial growth of the transition region 107 and a direction of a load current within the transition region 107 may be in parallel to the extension direction Z.

Further, creating (cf. step 24) the transition region 107 may include applying an ion implantation. For example, the epitaxial growth of the transition region 107 is interrupted and the ion implantation is applied or, respectively, after epitaxial growth of the transition region 107, an ion implantation is carried out before creating the drift region 105 on top of the transition region 107. Such implantation may allow for adjusting the dopant concentration profile along the extension direction Z.

In an embodiment, the amount of dopants admixed during the epitaxial growth of the transition region 107 changes at least twice over time, or even at least three times, wherein each change may include a reduction of the amount of dopants by a factor of at least two. For example, a first change of the amount of admixed dopants may cause the change in dopant concentration within the section 1077 of the lower subregion 1073, and a second change of the amount of admixed dopants may cause the change in dopant concentration within the section 1076 of the central subregion 1072, and/or a third change of the amount of admixed dopants may cause the change in dopant concentration within the section 1075 of the upper subregion 1071. In accordance with another embodiment, at least one of said changes in dopant concentration may additionally or alternatively achieved by applying an ion implantation. Further, not only the amount may be changed, but also the dopant material, in accordance with an embodiment.

In addition, when carrying out the at least one epitaxy processing step for creating the transition region 107, further parameters may be controlled e.g., at least one of a deposition rate, a deposition temperature and a dopant gas flow, in accordance with an embodiment.

As has already been indicated with respect to the description of FIGS. 5-7, the carrier 101 may be at least partially removed within the processing method 2, e.g., so to expose at back surface of the contact region 109 and to provide a second load terminal 12 thereon, which may include a backside metallization and diffusion barrier.

The embodiments described above include the recognition that power semiconductor devices may be brought into critical operational states, e.g., during switching processes, in a short circuit case and also due to so-called streamers that may have been caused by cosmic radiation. Such critical operational states may usually induce a failure of the application in which the power semiconductor device is being employed, e.g., a failure of a power converter or a power supply. Further, some of such critical operational states, e.g., those due to so-called streamers that may have been caused by cosmic radiation are difficult or even impossible to predict and, hence, countermeasures addressing such operational states are either not available or are very complex. Accordingly, it would be beneficial if, for example, the configuration of a power semiconductor device would be such that the risk that cosmic radiation induces said streamers is reduced. The inventors have recognized that such risk reduction may be achieved, in accordance with an embodiment, by a doped transition region coupled between a drift region and a semiconductor contact region that has a certain dopant concentration profile, wherein such profile may be provided by epitaxially growing the transition region so as to ensure a minimum dopant concentration in the transition region and/or a dopant concentration that varies along an extension direction.

In the above, embodiments pertaining to semiconductor device processing methods were explained. For example, these semiconductor devices are based on silicon (Si). Accordingly, a monocrystalline semiconductor region or layer, e.g., the regions 10, 101, 103, 105, 107, 109 of exemplary embodiments, can be a monocrystalline Si-region or Si-layer. In other embodiments, polycrystalline or amorphous silicon may be employed.

It should, however, be understood that the semiconductor body 10 and components, e.g., regions 100, 110, 101 and 12 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "having" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing a power semiconductor device, the method comprising:
   creating a doped contact region on top of a surface of a carrier, wherein creating the contact region includes carrying out at least one epitaxy processing step;
   creating, on top of the contact region, a doped transition region having a maximum dopant concentration of at least $0.5*10^{15}$ cm$^{-3}$ for at least 70% of a total extension of the doped transition region in an extension direction and a maximal dopant concentration gradient of at most $3*10^{22}$ cm$^{-4}$, wherein a lower subregion of the doped transition region is in contact with the contact region and has a maximum dopant concentration at least 100 times higher than a maximum dopant concentration of an upper subregion of the doped transition region, and wherein creating the doped transition region includes carrying out at least one epitaxy processing step; and
   creating a doped drift region on top of the upper subregion of the doped transition region, the doped drift region having a lower dopant concentration than the upper subregion of the doped transition region.

2. The method of claim 1, wherein the doped transition region further includes a central subregion having a dopant concentration that varies along the extension direction and being arranged in between the upper subregion and the lower subregion, the central subregion having a maximum dopant concentration which is at least a factor 5 higher than the maximum dopant concentration of the upper subregion.

3. The method of claim 1, wherein creating the doped transition region further includes applying an ion implantation.

4. The method of claim 1, further comprising replacing the carrier at least partially with a load terminal.

5. The method of claim 1, further comprising introducing dopants of the doped contact region during the at least one epitaxy processing step.

6. The method of claim 1, further comprising introducing dopants of the doped contact region by implantation.

7. The method of claim 1, further comprising introducing dopants of the doped contact region by diffusion.

8. The method of claim 1, wherein each of the doped contact region, the doped drift region and the doped transition region are doped with dopants of the same conductivity type.

9. The method of claim 1, wherein each of the doped contact region, the doped drift region and the doped transition region are doped with the same dopant material.

10. The method of claim 1, wherein the doped contact region comprises dopants of a conductivity type complementary to the conductivity type of dopants present in the doped drift region.

11. The method of claim 1, wherein the doped transition region is doped with n-type dopants.

12. The method of claim 1, wherein the doped transition region is doped with a dopant material comprising at least one of phosphorus, antimony and arsenic.

13. The method of claim 1, wherein the doped contact region forms a backside emitter region or a drain region of the power semiconductor device.

14. The method of claim 1, further comprising forming a body region in contact with the doped drift region, wherein the body region is doped with dopants of a conductivity type complementary to dopants included in the doped drift region, wherein a transition between the body region and the doped drift region forms a pn-junction configured to block a voltage of at least 20 V applied between a first load terminal and a second load terminal of the power semiconductor device.

15. The method of claim 1, wherein the power semiconductor device has one of a MOSFET configuration, an IGBT configuration and a diode configuration.

* * * * *